US007999571B2

(12) United States Patent
Norman

(10) Patent No.: US 7,999,571 B2
(45) Date of Patent: Aug. 16, 2011

(54) STATE MACHINES USING NON-VOLATILE RE-WRITEABLE TWO-TERMINAL RESISTIVITY-SENSITIVE MEMORIES

(75) Inventor: Robert Norman, Pendleton, OR (US)

(73) Assignee: Unity Semiconductor Corporation, Sunnyvale, CA (US)

( * ) Notice: Subject to any disclaimer, the term of this patent is extended or adjusted under 35 U.S.C. 154(b) by 0 days.

(21) Appl. No.: 12/927,546

(22) Filed: Nov. 15, 2010

(65) Prior Publication Data
US 2011/0062989 A1 Mar. 17, 2011

Related U.S. Application Data

(62) Division of application No. 12/006,199, filed on Dec. 30, 2007, now Pat. No. 7,834,660.

(51) Int. Cl.
*H03K 19/173* (2006.01)
(52) U.S. Cl. ............................................. 326/46; 326/38
(58) Field of Classification Search ............... 326/37–41, 326/46, 47, 101
See application file for complete search history.

(56) References Cited

U.S. PATENT DOCUMENTS

| 4,882,711 A * | 11/1989 | Guillot | 365/229 |
| 6,145,020 A * | 11/2000 | Barnett | 710/8 |
| 2009/0067276 A1 * | 3/2009 | Pekny | 365/230.03 |

* cited by examiner

*Primary Examiner* — Shawki S Ismail
*Assistant Examiner* — Thienvu V Tran

(57) ABSTRACT

State machines using resistivity-sensitive memory elements are disclosed. The state machine includes a next state logic comprising a non-volatile memory including a resistivity-sensitive memory element and receiving an input, a state storage device connected to the next state logic including a connection to provide a state of the state machine to the next state logic, and an output connect to the state register to output the state of the state machine. The resistivity-sensitive memory elements may be two-terminal resistivity-sensitive memory elements. The two-terminal resistivity-sensitive memory elements may store data as a plurality of conductivity profiles that can be non-destructively read by applying a read voltage across the terminals of the memory elements, and new data can be written by applying a write voltage across the terminals. The two-terminal resistivity-sensitive memory elements retain stored data in the absence of power and may be configured into a two-terminal cross-point memory array.

19 Claims, 7 Drawing Sheets

STATE MACHINES USING NON-VOLATILE RE-WRITEABLE TWO-TERMINAL RESISTIVITY-SENSITIVE MEMORIES

CROSS-REFERENCES TO RELATED APPLICATIONS

This application is related to U.S. patent application Ser. No. 11/095,026, filed Mar. 30, 2005, U.S. Published Application No. 2006/0171200, and titled "Memory Using Mixed Valence Conductive Oxides."

This application is related to U.S. patent application Ser. No. 12/005,685, filed on Dec. 28, 2007, U.S. Published Application No. 2009/0172350, and titled "Non-Volatile Processor Register."

FIELD OF THE INVENTION

The present invention relates to programmable memories and specifically to State Machines Using Resistivity-Sensitive Memories.

BACKGROUND

A state machine is a sequential logic machine that can produce an output based on an input and/or the current state of the machine. The "state" of a state machine may indicate its current operating status. A state machine may output a number of different states based on different inputs. For example, a simple state machine may be a door with two possible states, open and closed. An input to the door may be a command to open or close the door. If the input was a command to open the door, and the current state of the door was closed, the state machine would open the door, and the output would report either that the door was open or that the command to open the door had been issued and that the door was open, depending on which type of state machine had been chosen. State machines may also represent more general logic functions that represent other conditions.

Two types of state machines are Moore state machines and Mealy state machines. A Moore state machine produces an output based on the state of the state machine. The output of the Moore state machine changes when the state transitions. A Mealy state machine produces an output based on the input and the state. The Mealy state machine produces a pulse while the Moore state machine produces a level output. Either type may be used for a variety of applications depending on various design considerations.

State machines may be used for the development of various systems. In the development of these systems, state machines must often be updated in the field using limited programming resources. Available solutions, some of which are described below, have significant drawbacks in terms of ease of programming and speed.

State machines may be implemented used a variety of architectures. Early implementations used discrete circuitry or programmable read only memories (PROMs). These implementations were non-volatile (i.e., they retain their memory, and therefore their programming, when power is removed); however reprogramming these devices to reflect a change in a state machine is a cumbersome and time consuming process.

Newer implementations may use random access memory (RAM) based field programmable gate arrays (FPGAs) which may use a static RAM (SRAM). These implementations were easier to program, but still required dedicated software and additional cost. Also, RAM-based FPGAs are volatile and require an additional non-volatile memory to program the FPGAs when booting. This requirement increases the cost, power consumption, size, and boot time of these implementations. Other implementations include anti-fuse FPGAs, which can only be programmed once.

Flash memories have also been used to implement state machines. Flash memories are nonvolatile, but require an erase state before writing, which greatly increases reprogramming time. Flash memories also require an operating system (OS), which increase access time.

There are continuing efforts to improve the implementation of state machines.

BRIEF DESCRIPTION OF THE DRAWINGS

Various embodiments of the invention are disclosed in the following detailed description and the accompanying drawings. Although the Drawings depict various examples of the invention, the invention is not limited by the depicted examples. Furthermore, the depictions are not necessarily to scale.

DETAILED DESCRIPTION

Figure 1A:
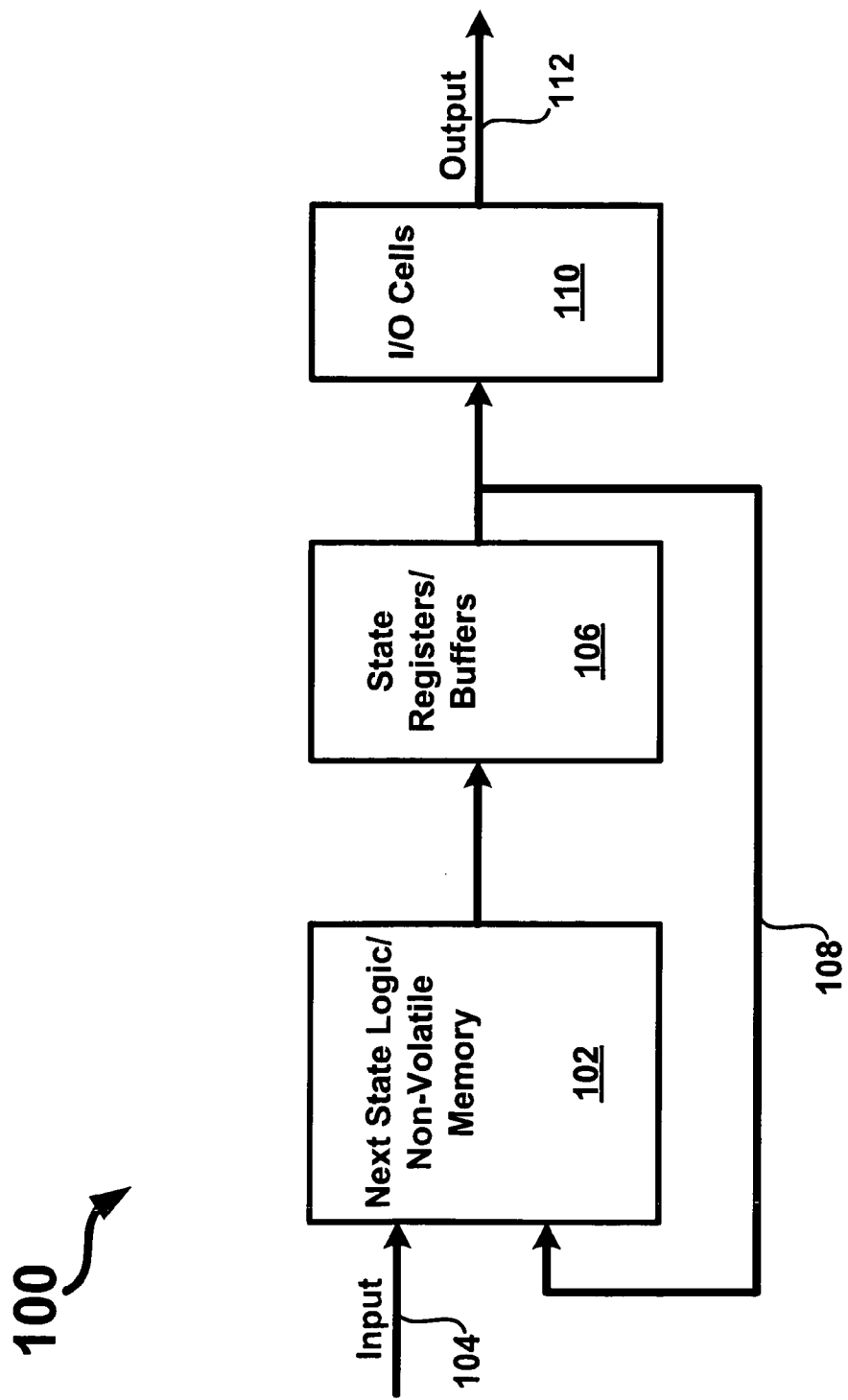
FIG. 1A illustrates a Moore state machine using a non-volatile rewriteable memory comprising a resistivity-sensitive memory element according to an embodiment.

A detailed description of one or more examples is provided below along with accompanying figures. The detailed description is provided in connection with such examples, but is not limited to any particular embodiment. The scope is limited only by the claims and numerous alternatives, modifications, and equivalents are encompassed. Numerous specific details are set forth in the following description in order to provide a thorough understanding. These details are provided for the purpose of example and the described embodiments may be implemented according to the claims without some or all of these specific details. For the purpose of clarity, technical material that is known in the technical fields related to the embodiments has not been described in detail to avoid unnecessarily obscuring the description.

According to various embodiments, state machines may be implemented using non-volatile rewriteable memories including a resistivity-sensitive memory element. Moore and Mealy state machines may include a next state logic comprising the non-volatile rewriteable memory that may be programmed according to the specifications of the state machine. The next state logics are connected to state registers or buffers. A Mealy state machine includes, and a Moore state machine may optionally include an output logic connected to the state registers also comprising the non-volatile rewriteable memory. Other architectures may also include multiple state machines controlled by a configuration device that can change the programming of the state machines and the configuration of the multiple state machines.

Memory Technology

Non-volatile memory technologies may be used with memory systems to develop high density, low cost, and fast access memories. Access may refer to accessing and performing data operations (e.g., read, write, erase) on a memory or memory array. The memory array may provide vertically-configured cell arrays (e.g., vertically-stacked, cross-point, two or three-terminal, non-volatile memory arrays) with reduced die sizes and manufacturing costs and system-level functionality. Examples of memory arrays may include vertically-stacked, two or three-terminal, cross-point memory arrays, such as those described in U.S. patent application Ser. No. 11/095,026, filed Mar. 30, 2005, now U.S. Published Application No. 2006/0171200, and titled "Memory Using Mixed Valence Conductive Oxides," hereby incorporated by reference in its entirety and for all purposes, describes two terminal memory cells that can be arranged in a cross point array. The application describes a two terminal memory element that changes conductivity when exposed to an appropriate voltage drop across the two terminals. The memory element includes an electrolytic tunnel barrier and a mixed valence conductive oxide. The voltage drop across the electrolytic tunnel barrier causes an electrical field within the mixed valence conductive oxide that is strong enough to move oxygen ions out of the mixed valence conductive oxides and into the electrolytic tunnel barrier. Oxygen depletion causes the mixed valence conductive oxide to change its valence, which causes a change in conductivity. Both the electrolytic tunnel barrier and the mixed valence conductive oxide do not need to operate in a silicon substrate, and, therefore, can be fabricated above circuitry being used for other purposes (such as selection circuitry).

The two-terminal memory elements can be arranged in a cross point array such that one terminal is electrically coupled with an x-direction line and the other terminal is electrically coupled with a y-direction line. A stacked cross point array consists of multiple cross point arrays vertically stacked upon one another, sometimes sharing x-direction and y-direction lines between layers, and sometimes having isolated lines. When a first write voltage $V_{W1}$ is applied across the memory element, (typically by applying $\frac{1}{2} V_{W1}$ to the x-direction line and $\frac{1}{2} -V_{W1}$ to the y-direction line) it switches to a low resistive state. When a second write voltage $V_{W2}$ is applied across the memory element, (typically by applying $\frac{1}{2} V_{W2}$ to the x-direction line and $\frac{1}{2} -V_{W2}$ to the y-direction line) it switches to a high resistive state. Typically, memory elements using electrolytic tunnel barriers and mixed valence conductive oxides require $V_{W1}$ to be opposite in polarity from $V_{W2}$.

Fast accesses for data operations may be achieved by using page buffers to allow multiple data operations to be performed substantially simultaneously (i.e., buffering data from a read and a write access). Further, various embodiments of data packet formats and data communication protocols may be used to indicate how data from different data operations (e.g., read, write) may be aligned to allow fast accesses to a memory array.

The memory technology described above comprises a resistivity-sensitive memory element according to an embodiment, which may be a two- or three-terminal memory element. The resistivity-sensitive memory element detects changes in resistance in a memory element as either a 0 or a 1 bit, as is described in the above-referenced U.S. patent. The memory technology is also non-volatile. In other words, when power is removed from the memory, the memory retains its contents. The memory technology requires no refresh, which improves performance over other memory technologies. The memory technology also requires no erase for writes and does not require an operating system (OS), improving performance. Additionally, the memory elements are physically smaller than many other memories, increasing densities leading to smaller sizes and reduced power consumption. The memory arrays can also be stacked on top off one another in a vertical manner for increased density.

Moore State Machines

FIG. 1A illustrates a Moore state machine using a non-volatile rewriteable memory comprising a resistivity-sensitive memory element according to an embodiment. A Moore state machine has an output that is only dependent on the current state of the machine. A Moore state machine may receive an input which changes the state of the state machine. Depending on the input, the state of the machine may change to any of a variety of states for which the machine is programmed. The output of the machine is then dependent on that current state.

The Moore state machine 100 includes a next state logic 102 which comprises a non-volatile rewriteable memory including a resistivity-sensitive memory element such as the memory technology described above. According to an embodiment, the resistivity-sensitive memory element may be a two-terminal resistivity-sensitive memory element. The next state logic 102 advances the state machine to the next state depending on an input 104. The next state logic 102 may be programmed using techniques to program a memory having the memory technology described above. Since the next state logic 102 uses a non-volatile memory, when the device containing the Moore state machine 100 is powered down, it retains the instructions used to implement the Moore state machine. Further, since the next state logic 102 comprises a rewritable memory, the next state logic 102 can be reprogrammed in the field and reused when it is being debugged or when other changes are made.

The next state logic 102 is connected to a state storage device such as state registers or buffers 106. The state registers 106 store a current state of the Moore state machine 100. The state registers 106 may be conventional registers or registers comprising a resistivity-sensitive memory element (e.g., a two-terminal memory element) such as those described in U.S. patent application Ser. No. 12/005,685, filed on Dec. 28, 2007, U.S. Published Application No. 2009/0172350, and titled "Non-Volatile Processor Register", which is herein incorporated by reference for all purposes.

The state of the Moore state machine 100, as stored in the state registers 106, is fed back to the next state logic 102 through at least one connection 108. According to an embodiment, this feedback may be a sequencer-type event. Input/output (I/O) cells or buffers 110 may be used to store or provide an output 112 of the Moore state machine 100. It is understood that the I/O cells 110 are optional and that the output 112 of the Moore state machine 100 may be provided in other ways. The output 112 of the Moore state machine 100 can further be deglitched if necessary.

According to an embodiment, a semiconductor device such as an integrated circuit (IC) or application specific integrated circuit (ASIC) including memory conforming to the memory technology described above may be used to implement one or more state machines. The semiconductor device may be a field programmable gate array (FPGA), for example. The memories described herein, for example, the next state logic 102, may comprise a portion of the semiconductor device. These memories may be programmed using instructions for specific state machines. For example, the instructions may include instructions to advance to the next state as well as the various states available (in the next state logic) and instructions to format the output of the state machine (in an output logic, described below). These memories are nonvolatile, fast access memories that can be easily reprogrammed in the field.

Figure 1B:
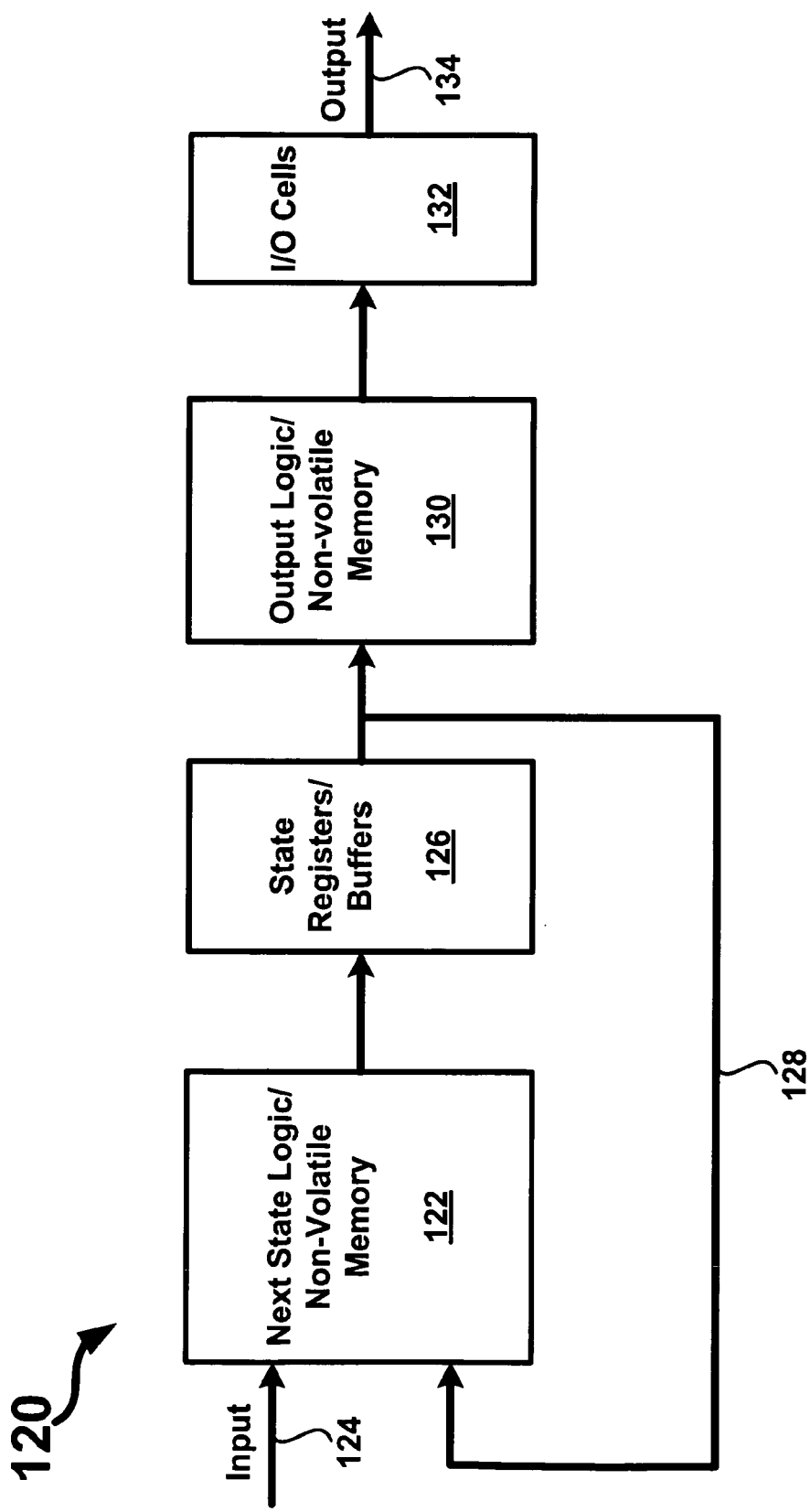
FIG. 1B illustrates a Moore state machine with an output logic that allows for various output values according to an embodiment.

FIG. 1B illustrates a Moore state machine 120 with an output logic that allows for various output values according to an embodiment. The Moore state machine 120 may be used where it is desirable to have an output logic, which may include a lookup table, which offers flexibility in generating the output signals from the Moore state machine 120. According to an embodiment, the Moore state machine 120 has combinatorial logic outputs which may be implemented in the output logic.

The Moore state machine 120, like the Moore state machine 100, includes a next state logic 122 comprising a non-volatile rewriteable memory using a resistivity-sensitive memory element (e.g., a two-terminal memory element) such as the memory technology above. The next state logic 122 receives an input 124 which may indicate a state change is wanted. The next state logic 122 is further connected to a state storage device such as state registers or buffers 126, which may also comprise a resistivity-sensitive memory element (e.g., a two-terminal memory element) such as those described in the related document. The state of the machine 120 is fed back to the next state logic 122 through at least one connection 128.

An output logic 130 may comprise a resistivity-sensitive memory element (e.g., a two-terminal memory element) such as the memory technology above. The output logic 130 may indicate how to produce an output 134 for the Moore state machine 120. For example, the output logic 130 may include a look table that may include several different outputs that can be activated based on the state of the Moore state machine 120. The output logic 130 may also be programmed using techniques to program a resistivity-sensitive non-volatile memory. The output logic 130 may be programmed to include instructions specific to an individual state machine that may be desired by a user.

For example, the Moore state machine 120 may receive an input 122 to change its state. The next state logic 124 may then receive the input 122 to change the state and depending on the instructions in the next state logic 124, the state is changed. The new state is then stored by the state registers 126. The state is outputted through the output logic 130 to I/O cells 132. The output logic 130 indicates the specific output 134 for the current state of the Moore state machine 120.

Mealy State Machine

Figure 2:
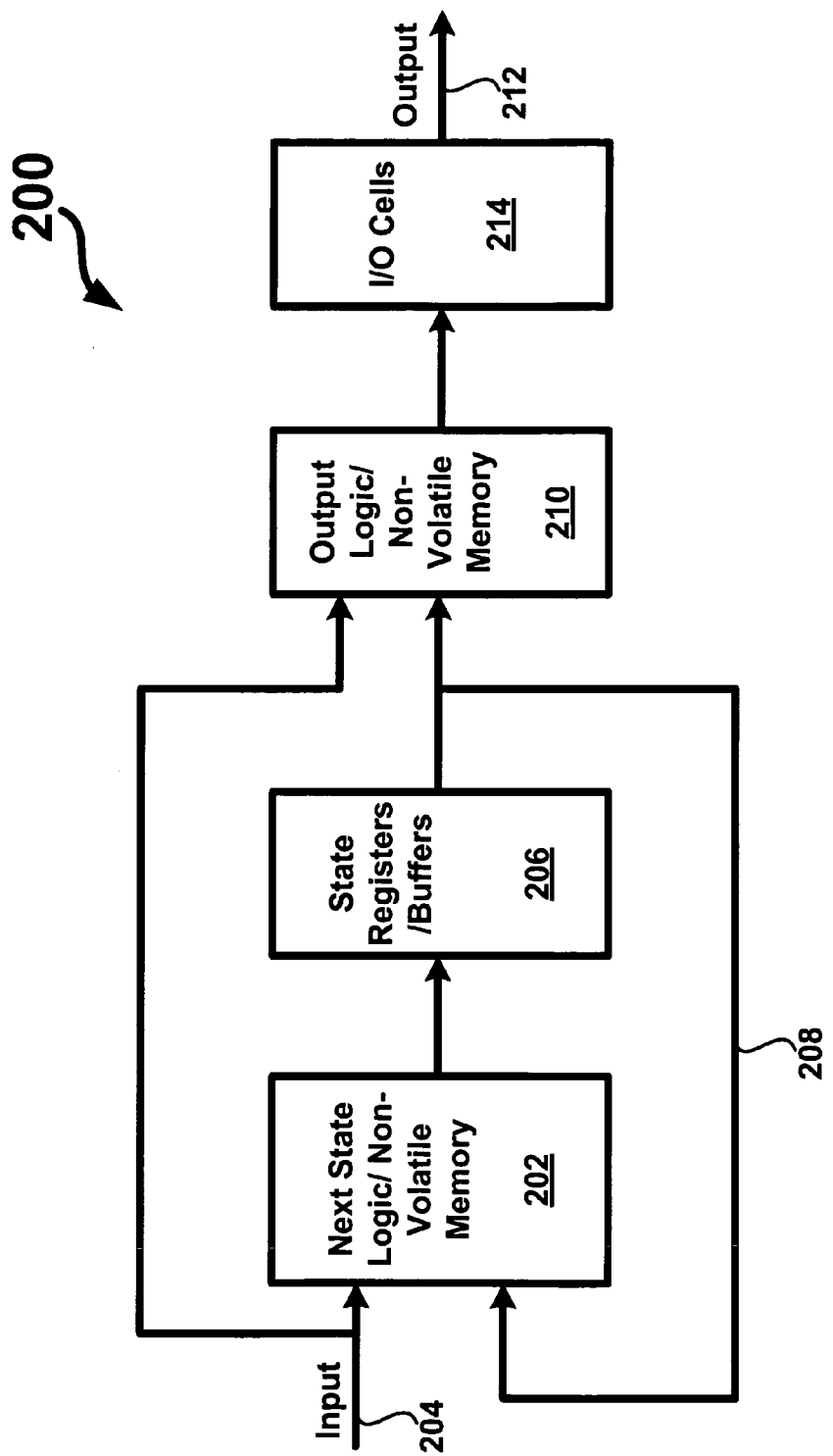
FIG. 2 illustrates a Mealy state machine using a non-volatile rewriteable memory comprising a resistivity-sensitive memory element according to an embodiment.

FIG. 2 illustrates a Mealy state machine using a non-volatile rewriteable memory comprising a resistivity-sensitive memory element according to an embodiment. A Mealy state machine 200 has an output based on a current state and an input of the state machine, as discussed above.

The Mealy state machine 200 includes a next state logic 202 which comprises a non-volatile rewriteable memory that comprises a resistivity-sensitive memory element (e.g., a two-terminal memory element). The next state logic 202 receives an input 204. The input 204 may indicate, for example, that the next state logic 202 should advance the Mealy state machine 200 to the appropriate state in response to the input 204.

A state storage device such as state registers or buffers 206 store the current state of the Mealy state machine 200. The state registers 206 may be conventional registers or may comprise a non-volatile rewriteable memory comprising a resistivity-sensitive memory element (e.g., a two-terminal memory element) such as those described above. A state of the Mealy state machine 200, as stored in the state registers 206, is fed back to the next state logic 202 through at least one connection 208.

An output logic 210, which may comprise a non-volatile rewriteable memory comprising a resistivity-sensitive memory element (e.g., a two-terminal memory element) receives the input 204 and the state of the Mealy state machine 200 to produce an output 212. The output logic 210 may also be programmable to produce a specific output based on the input 204 and the state of the Mealy state machine 200. The output 212 may optionally be stored in I/O cells 214 before it is output.

Combination State Machines

Figure 3:
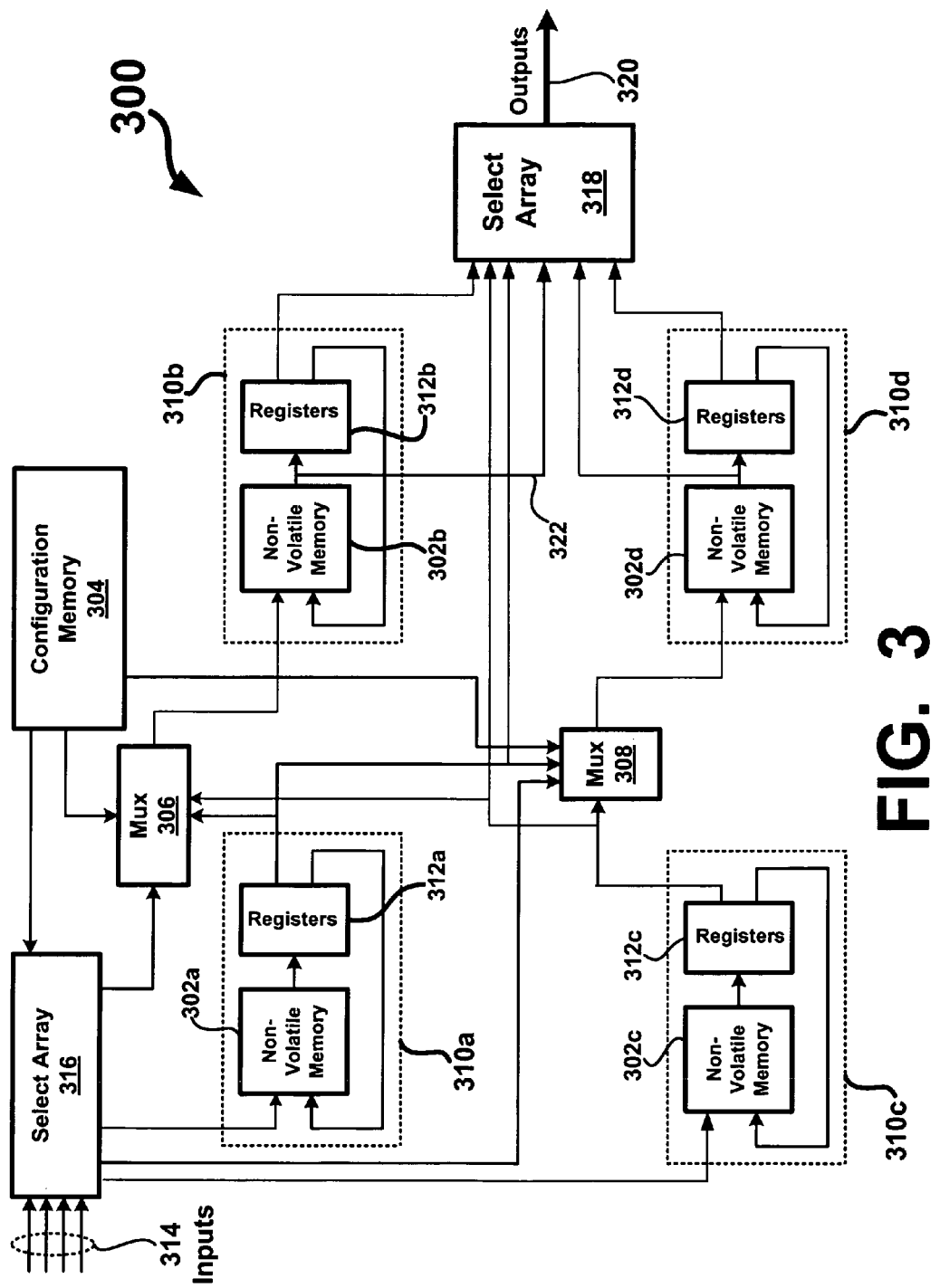
FIG. 3 illustrates an architecture for creating a combination state machine according to an embodiment.

FIG. 3 illustrates an exemplary architecture 300 for creating a combination state machine according to an embodiment. The architecture 300 may be configured to have a combination of state machines such as one or more Moore state machines, one or more Mealy state machines, or a combination thereof. When combination state machines are designed using the architecture 300 or a similar architecture, multiple state machines with different instructions and purposes working toward a single goal can be implemented using a single IC or ASIC. For example, a first and a second state machine may be implemented. The second state machine may not be able to proceed until the first state machine has met a predetermined condition. A handshake between the two state machines can indicate that the second state machine may proceed. Using the architecture 300 or similar architectures, any number of state machines can be combined in such a fashion to complete complex operations.

The architecture 300 includes four non-volatile memories 302a-302d, which may comprise a non-volatile rewriteable memory comprising a resistivity-sensitive memory element (e.g., a two-terminal memory element) using the memory technology described above. The architecture 300 further comprises a configuration device such as a configuration memory 304 that programs the non-volatile memories 302a-302d and controls two multiplexers 306 and 308. As will be discussed further, the configuration memory 304 may include instructions to program the state machines such as instructions used to implement a next state logic such the next state logics 102, 122, and 202, above. Using these elements, the architecture 300 is a flexible implementation that can be used to create a variety of state machines.

The configuration memory 304 is a programmable memory or registers that stores instructions for configuring the architecture 300. The configuration memory 304 may further include instructions to program the non-volatile memories 302a-302d to perform different functions, for example as next state logics or as output logics, as described above. The configuration memory 304 may also include instructions to change the routing within the architecture 300 to designate different types of state machines. For example, either Moore, Mealy, or a combination of Moore and Mealy state machines may be implemented using the architecture 300. According to an embodiment, the configuration memory 304 may be programmed using a sequence of interface pins.

The configuration memory 304 may be a memory such as a non-volatile memory or RAM, or may comprise registers and be referred to as configuration registers. According to an embodiment, the configuration memory 304 may comprise a non-volatile rewriteable memory comprising a resistivity-sensitive memory element (e.g., a two-terminal memory element).

As an example of implementing multiple state machines, the architecture 300 may be configured to include four Moore state machines 310a, 310b, 310c, and 310d. The Moore state machines 310a-310d highlight the components that may be included in a Moore state machine when using the architecture 300. The Moore state machines 310a-310d are similar to the Moore state machine 100 depicted in FIG. 1A, in that they are programmed to include a next state logic and a state storage device such as state registers. To that end, the non-volatile memories 302a-302d may be programmed according to instructions contained in the configuration memory to be next state logics, such as the next state logics 102 and 122, above. Each of the Moore state machines 310a-310d may be completed with state registers 312a-312d, respectively. The state registers 312a-312d may also comprise a resistivity-sensitive memory element (e.g., a two-terminal memory element) as described in the related document.

Inputs 314 are received by an input select array 316. The input select array 316 can be controlled by the configuration memory 304 to direct the various inputs 314 to the non-volatile memories 302a-302d and to the multiplexers 306 and 308. The state of the various state machines as stored in the state registers 312a-312d are fed into an output select array 318, which may be used to provide the appropriate outputs 320 for the architecture 300 depending on the specific state machine. According to an embodiment, the input select array 316 and the output select array 318 may be combined into a single select array. A sample circuit for a select array is described below regarding FIG. 4.

Using the example above, if the architecture 300 is to be configured into four single Moore state machines 310a-310d, the configuration memory 304 can instruct the input select array 316 and the multiplexers 306 and 308 to provide an individual input to each of the non-volatile memories 302a-302d. The configuration memory 304 can also provide appropriate instructions to each of the non-volatile memories 302a-302d so that they may function as next state logics.

If, however, a Mealy state machine is desired, two of the non-volatile memories, for example, the non-volatile memories 302a and 302b can be programmed to be a next state logic (e.g., the next state logic 202) and an output logic (e.g., the output logic 212), respectively. The multiplexer 306 can then be switched so that the both the state from the state registers 312a and the input from the inputs 314 are inputted to the non-volatile memory 302b. The output select array 318 can then be configured to receive the output from the non-volatile memory 302b over a connection 322. In this way a Mealy state machine can be realized.

Likewise, a Mealy state machine can be configured using the non-volatile memories 302c and 302d along with the multiplexer 308. Further a combination of two Moore state machines and a Mealy state machine may also be configured using the architecture 300. It is understood however, that the architecture 300 is given as an example only, and that various other architectures can be envisioned within the bounds of various embodiments. For example, any number of non-volatile memories, multiplexers, and registers may be realized depending on the scale of a specific application.

Figure 4:
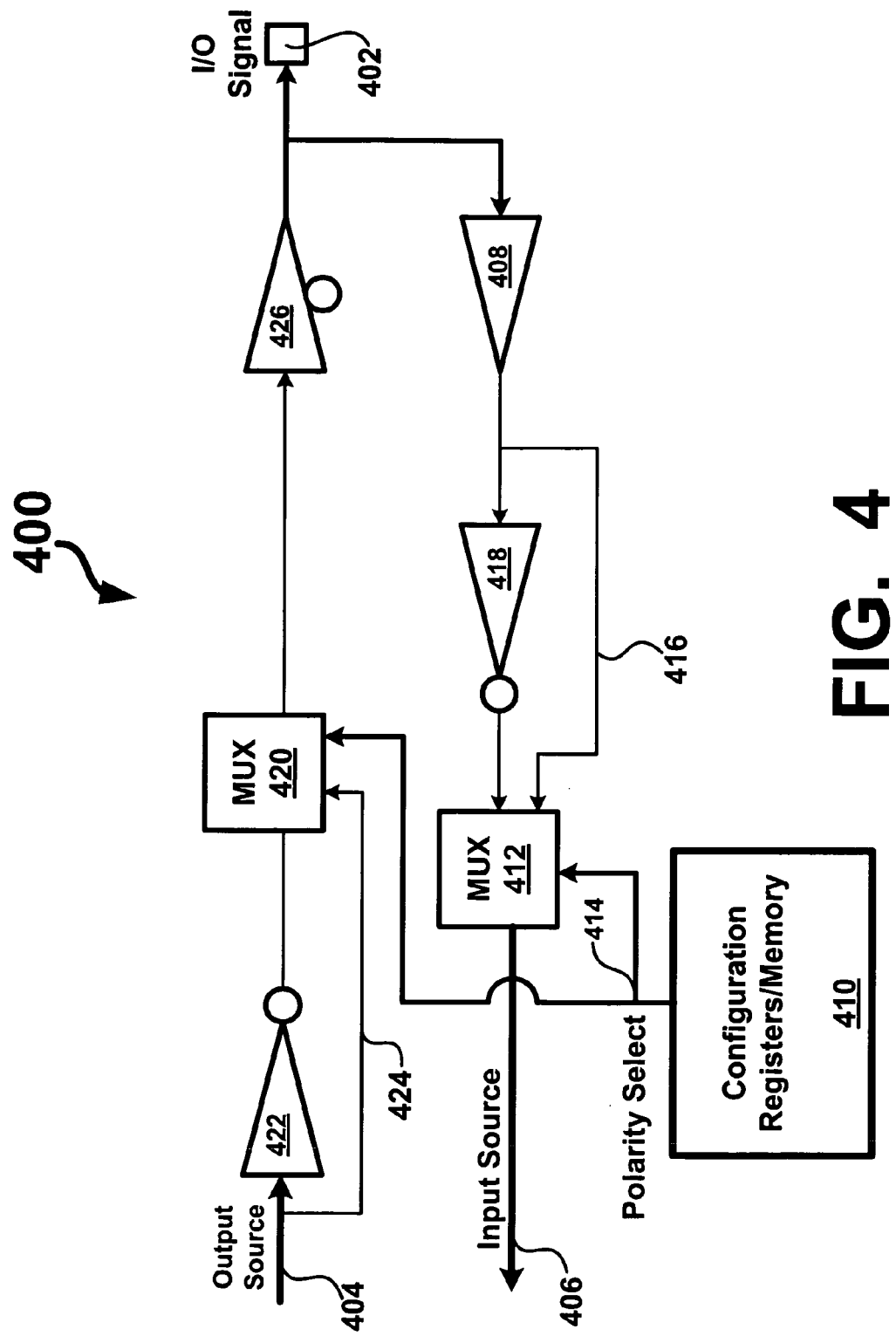
FIG. 4 illustrates a select array controlled by a configuration memory according to an embodiment.

FIG. 4 illustrates a select array controlled by a configuration memory according to an embodiment. A select array may determine how an input or an output signal is to be used. For example, a signal may be inverted before it is input or output. The select array 400 may be one of the select arrays 316 or 318 described above, or may be a combination input/output select array. A select array can be used to route multiple input/output (I/O) signals to and from other elements of configurable state machine architecture such as the architecture 300.

An input/output (I/O) signal 402 either originates from the architecture 300 (e.g., as one of the outputs 320) or is directed into the architecture 300 (e.g., as one of the inputs 314). The I/O signal 402 may therefore either be an input or an output depending on the current operation of the architecture 300. If the I/O signal 402 is currently an output signal, the select array 400 receives an output source 404 from one of the state registers 312a-312d or one of the non-volatile memories 302b or 302d, depending on the current configuration of the architecture 300. If the I/O signal 402 is currently an input signal, the select array 400 is directing an input source 406 to one of the non-volatile memories 302a or 302c or into one of the multiplexers 306 or 308.

If the I/O signal 402 is an input signal to the architecture 300, the signal is initially held in a buffer 408. From there, a configuration device such as the configuration memory 410 (e.g., the configuration memory 304) can select whether the polarity of the signal should be positive or negative. If the polarity is positive, the configuration memory 410 switches a multiplexer 412 using a polarity select line 414 to input an unmodified input signal from the line 416. If the polarity is negative, the multiplexer 412 is switched to receive the input signal through an inverter 416. The switched input of the multiplexer 406 is then the input source sent to various components of the architecture 300.

If the I/O signal 402 is an output signal from the architecture 300, the configuration memory 410 first uses the polarity select line 414 to determine whether output signal is inverted or not. If the output signal is to be inverted, the configuration memory 410 switches a multiplexer 420 so that the output signal is routed through an inverter 422. If the output signal is not to be inverted, the multiplexer 420 is switched so that the output signal travels along a line 424. The output signal then is held in a buffer 426 before it becomes the I/O signal 402.

Vertically Configured Memories

FIGS. 5A through 5D depict various vertical memory configurations according to various embodiments. According to an embodiment, the memory technology described above may be configured so that an IC or ASIC including memory of the memory technology and other semiconductor devices may be arranged into multiple vertically configured planes.

An IC may be configured so that logic comprising transistors and other semiconductor devices, such as the logic used to access the memory (i.e., the memory logic), multiplexers, inverters, buffers, and other devices are formed on a semiconductor substrate (e.g., a silicon Si wafer) located in a base (or bottom) logic plane. The memory may then be formed above the logic plane (e.g., on top of the logic plane) in one or more vertically configured planes. Using these vertical configurations significantly reduces the footprint of ICs created with this memory technology. FIGS. 5A through 5D are examples of various configurations that may be implemented with the state machines described above in reference to FIGS. 1A, 1B, 2, 3, and 4.

Figure 5A:
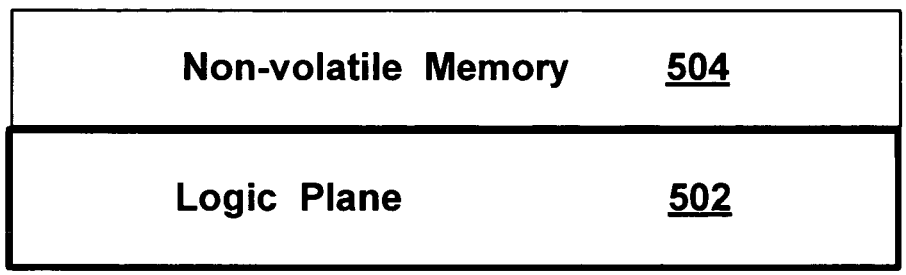
FIG. 5A illustrates an integrated circuit (IC) having a single plane of memory according to an embodiment.

FIG. 5A illustrates an IC 500 having a single plane of memory according to an embodiment. The IC 500 includes a logic plane 502 and memory plane 504. The logic plane 502, as mentioned above, includes semiconductor devices used to control the memory in the memory plane 504 (i.e., the memory logic), as well as other logic or memories that are not implemented in the memory plane 504. The memory plane 504 includes memory of the memory technology described above such as a memory comprising a resistivity-sensitive memory element (e.g., a two-terminal memory element).

The memory plane 504 may be electrically connected with the logic plane 502 using various interconnects such as a via which may be formed in the logic plane 502 prior to forming of the memory plane 504 above the logic plane 502. The IC 500 may be used to implement the state machine 100, since the state machine 100 uses a single non-volatile rewriteable memory for the next state logic 102.

Figure 5B:
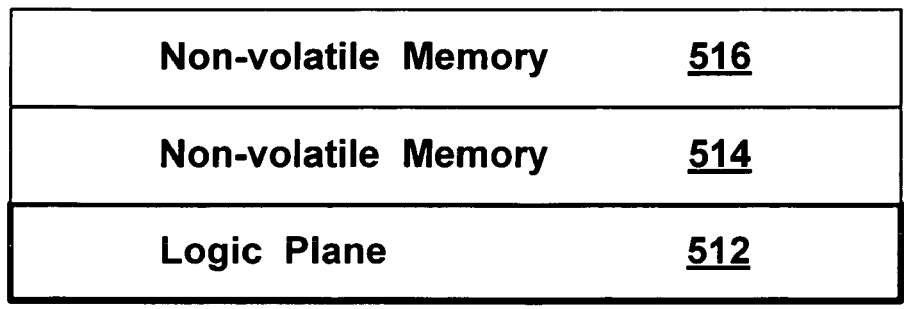
FIG. 5B illustrates an IC having two vertically stacked planes of memory.

FIG. 5B illustrates an IC 510 having two vertically stacked planes of memory. The IC includes a logic plane 512, a first memory plane 514 positioned on top of the logic plane 512, and a second memory plane 516 positioned on top of the first memory plane 514. The IC 510 can be used, for example, where two separate non-volatile memories are used. The state machines 120 and 200 use a non-volatile memory programmed as a next state logic and a non-volatile memory programmed as an output logic and may be implemented using the IC 510.

Figure 5C:
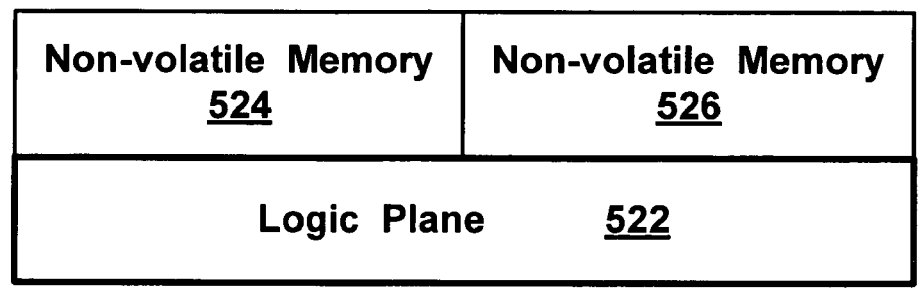
FIG. 5C illustrates an IC using two horizontally configured memories according to an embodiment.

FIG. 5C illustrates an IC 520 using two horizontally configured memories according to an embodiment. The IC 520 includes a logic plane 522 and two memory planes 524 and 526. The IC 520 may be used, for example, with the state machines 120 and 200, configuring the memories 524 and 526 to be one of a next state logic or an output logic. Here the memory plane 524 is located adjacent to the memory plane 526 in the same horizontal plane.

Figure 5D:
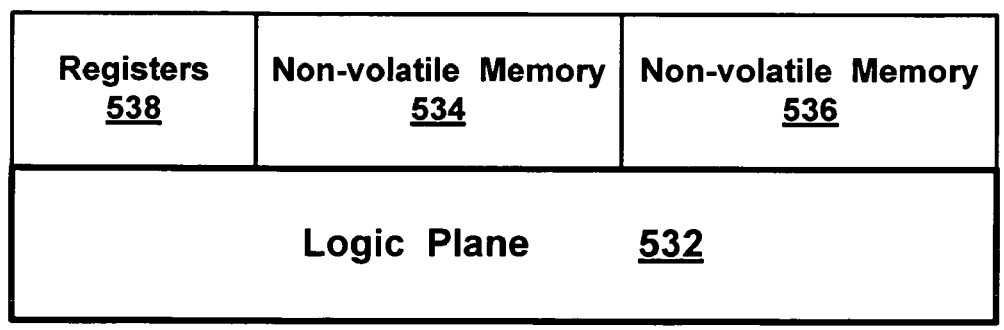
FIG. 5D illustrates an IC including non-volatile rewriteable registers according to an embodiment.

FIG. 5D illustrates an IC 530 including non-volatile rewriteable registers according to an embodiment. The IC 530 is similar to the IC 530 in that it includes a logic plane 532 and two horizontally configured memory planes 534 and 536. The IC 530 also includes non-volatile rewriteable registers 538 comprising a two-terminal resistivity-sensitive memory element such as used with the memory technology described above. The register 538 and the memories 534 and 536 are positioned on top of the logic plane 532. The registers 538 may be, for example, state registers such as the state registers 106, 126, or 206, or configuration registers such as the configuration memory 304.

It is understood that although specific vertical configurations are shown here that other configurations can be realized. For example, additional memory planes may be added either vertically or horizontally and those planes may include one or more registers such as the register 538.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. An integrated circuit including a non-Flash non-volatile state machine, comprising:
    a silicon semiconductor substrate including circuitry fabricated in a logic plane of the silicon semiconductor substrate, the circuitry including
        a configuration device operative to provide a configuration for a state machine, and
        a select array electrically coupled with the configuration device and operative to receive inputs and provide outputs; and
    at least one memory plane in direct contact with and fabricated directly above the silicon semiconductor substrate, the at least one memory plane including
        a non-volatile re-writeable memory comprising a two-terminal resistivity-sensitive memory element electrically coupled with the select array and operative to receive the inputs and the configuration from the select array, the non-volatile re-writeable memory is configured to implement the state machine,
    wherein the non-volatile re-writable memory Includes at least one two-terminal cross-point array, each two-terminal cross-point array Including a plurality of first conductive array lines, a plurality of second conductive array lines arranged orthogonally to the plurality of first conductive array lines, and a plurality of the two-terminal resistivity-sensitive memory elements, each two-terminal resistivity-sensitive memory element is positioned between a cross-point of a unique pair of first and second conductive array lines and is electrically in series with Its respective pair of first and second conductive array lines, and
    wherein each two-terminal resistivity-sensitive memory element is electrically coupled with the select array through Its respective pair of first and second conductive array lines.

2. The integrated circuit of claim 1, wherein the select array comprises an input select array and an output select array.

3. The integrated circuit of claim 1, wherein the configuration device is configured to determine the configuration including a Moore state machine.

4. The integrated circuit of claim 1, wherein the configuration device is configured to determine the configuration including a Mealy state machine.

5. The integrated circuit of claim 4, wherein the non-volatile re-writable memory is programmed to be a next state logic.

6. The integrated circuit of claim 5 and further comprising:
    a second non-volatile re-writable memory including at least one other two-terminal resistivity-sensitive memory element configured to be an output logic.

7. The integrated circuit of claim 5 and further comprising:
    a state register to store a state of the state machine.

8. The integrated circuit of claim 7, wherein the state register comprises a second two-terminal resistivity-sensitive memory element.

9. The integrated circuit of claim 1, wherein the configuration device is configured to determine the configuration including a combination state machine.

10. The integrated circuit of claim 1, wherein the configuration device comprises non-volatile configuration registers.

11. The integrated circuit of claim 10, wherein the non-volatile configuration registers comprise a first plurality of the two-terminal resistivity-sensitive memory elements.

12. The integrated circuit of claim 1, wherein the two-terminal resistivity-sensitive memory element includes an electrolytic tunnel barrier in contact with and electrically in series with a mixed valence conductive oxide that includes mobile oxygen ions, the two-terminal resistivity-sensitive memory element is operative to store non-volatile data as a plurality of conductivity profiles.

13. The integrated circuit of claim 12, wherein the electrolytic tunnel barrier has a thickness that less than 50 Å.

14. The integrated circuit of claim 13, wherein the electrolytic tunnel barrier is an electrolyte to the mobile oxygen ions and the mobile oxygen ions are transported between the he electrolytic tunnel barrier and the mixed valence conductive oxide only when a write voltage is applied across the two-terminal resistivity-sensitive memory element.

15. The integrated circuit of claim 13, wherein the thickness of the electrolytic tunnel barrier is configured to allow electron tunneling during data operations to the two-terminal resistivity-sensitive memory element.

16. The integrated circuit of claim 1 and further comprising:

a plurality of the memory planes that are in contact with one another and with the silicon semiconductor substrate and are horizontally configured adjacent to one another on a single plane.

17. The integrated circuit of claim 16, wherein at least one of the plurality of the memory planes is configured as a non-volatile re-writeable register.

18. The integrated circuit of claim 1 and further comprising:
a plurality of the memory planes that are in contact with one another and with the silicon semiconductor substrate and are vertically configured adjacent to one another on a plurality of vertically stacked planes.

19. The integrated circuit of claim 1, wherein a write operation to the two-terminal resistivity-sensitive memory element does not require a prior erase operation to the two-terminal resistivity-sensitive memory element.

* * * * *